United States Patent [19]
Lynch, Jr. et al.

[11] Patent Number: 5,173,694
[45] Date of Patent: Dec. 22, 1992

[54] BINARY DATA ENCODING AND DECODING USING A RATE 2/5 (2,18,2) CODE

[75] Inventors: Robert T. Lynch, Jr., San Jose; Daniel Rugar, Palo Alto; Todd C. Weigandt, San Jose, all of Calif.

[73] Assignee: International Business Machines Corporation, Armonk, N.Y.

[21] Appl. No.: 855,139

[22] Filed: Mar. 19, 1992

Related U.S. Application Data

[63] Continuation of Ser. No. 605,288, Oct. 29, 1990, abandoned.

[51] Int. Cl.⁵ ............................................. H03M 7/00
[52] U.S. Cl. .................................... 341/59; 358/261.1
[58] Field of Search ........................ 341/50, 51, 59, 63, 341/67, 68, 71, 72, 95, 106; 358/261.1, 261.2, 427, 261.4; 360/49; 369/59

[56] References Cited

U.S. PATENT DOCUMENTS

| | | | |
|---|---|---|---|
| 4,872,078 | 10/1989 | Gerber et al. | 360/114 |
| 4,928,187 | 5/1990 | Rees | 360/40 |
| 4,949,196 | 8/1990 | Davie et al. | 360/40 |

OTHER PUBLICATIONS

IEEE Transactions Magnetics, MAG-18, pp. 772-775, 1982, Funk (author).
Optical Data Storage Topical Meeting, (1989), reported in SPIE vol. 1078, pp. 265-270, Rugar et al. (authors).

*Primary Examiner*—A. D. Pellinen
*Assistant Examiner*—B. K. Young
*Attorney, Agent, or Firm*—Henry E. Otto, Jr.

[57] ABSTRACT

A rate 2/5 (2,18,2) code especially suitable for use with a resonant coil overwrite technique for magneto-optical recording. Serial binary input data is converted to serial binary code data that satisfies a (2,18,2) constraint and is reconverted to the serial binary input data. An encoder receives two sequential input bits and a five-bit state vector derived from an immediately preceding encoding operation, and generates a five-bit codeword and a new five-bit state vector based on the two input bits and five-bit state vector. A decoder converts the binary code data into five-bit codewords, converts each five-bit codeword sequentially into a reassigned three-bit codeword representation, then collects sets of four adjacent three-bit codeword representations. Each reassigned codeword representation is converted to a two-bit output corresponding to a then current set of said four three-bit codeword representations, and successive two-bit outputs are reconverted into the serial binary data.

7 Claims, 2 Drawing Sheets

ENCODER 11

BINARY DATA ENCODING AND DECODING USING A RATE 2/5 (2,18,2) CODE

This is a continuation of copending application Ser. No. 07/605,288, filed on Oct. 29, 1990, now abandoned.

This invention relates to run length limited codes that allow high density recording for optical and/or magnetic storage media, and more particularly to a unique method of encoding and decoding a rate 2/5 even-consecutive-zero constraint (2,18,2) code that is especially suitable for use with a resonant coil direct overwrite technique for magneto-optical recording.

BACKGROUND OF THE INVENTION

Run length limited (RLL) codes with an even-consecutive-zero constraint (i.e., an even number of "0" code bits between each "1" code bit) in addition to the usual d,k constraints, have heretofore been proposed and are designated (d,k,2).

For example, U.S. Pat. No. 4,928,187 describes a (2,8,2) code which means that it has run lengths of either 2, 4, 6 or 8 "0" code bits between each "1" code bit. This code is described as useful for a magnetic or optical medium data storage system. It has a rate ⅓, which means that for every data bit three code bits are required.

In the IEEE Transactions Magnetics, MAG-18, pp. 772-775 published in 1982, Funk described a similar rate ⅓ code satisfying the (2,8,2) constraint for magnetic recording.

In the Proceedings of the Optical Data Storage Topical Meeting (1989) reported in SPIE Vol. 1078 at pp. 265-270, it was reported that a rate 2/5 (2,18,2) code can be constructed using sliding block code techniques. However, no information was provided on how the code can be constructed or implemented. This (2,18,2) code requires five code bits for every two data bits and hence has a higher rate than the rate ⅓ codes. It is especially suitable for use with a resonant coil magneto-optic direct overwrite technique such as that described in U.S. Pat. No. 4,872,078, which discloses the only presently known field modulation overwrite technique compatible with parallel recording.

The (2,18,2) code has been found to be (a) superior to the (1,7), (2,7) and (2,8,2) codes when used for pulse width modulation (PWM) recording with either maximum slope or threshold detection channels; (b) superior to all other codes thus far modeled for optical partial response maximum likelihood (PRML) type channels, including (1,7) at linear densities above 45 kbpi; and (c) less susceptible to the effects of domain size variation. The main advantage of the (2,18,2) code in bit-by-bit detection is due to the wider detection window for a given user data density. The wide window is a consequence of the even-zero constraint which disallows every other clock period as a potential edge location.

There is a need for a practical method for encoding and decoding a rate 2/5 (2,18,2) code.

SUMMARY OF THE INVENTION

Serial binary input data is converted to serial binary code data that satisfies a (2,18,2) constraint and is reconverted to the serial binary input data. An encoder receives two sequential input bits and a five-bit state vector derived from an immediately preceding encoding operation, and generates a five-bit codeword and a new five-bit state vector based on said two input bits and five-bit state vector. A decoder converts the binary code data into five-bit codewords, converts each five-bit codeword sequentially into a reassigned three-bit codeword representation, then collects sets of four adjacent three-bit codeword representations. Each reassigned codeword representation is converted to a two-bit output corresponding to then current set of said four three-bit codeword representations, and successive two-bit outputs are reconverted into the serial binary data.

DESCRIPTION OF PREFERRED EMBODIMENT

The (2,18,2) code is a run length limited code with traditional (d,k) constraints and the additional constraint that all run lengths of consecutive zeros are even. The $d=2$ constraint serves to limit intersymbol interference and $k=18$ guarantees transitions close enough for timing recovery. The (2,18,2) code can be described by the finite state transition diagram shown in FIG. 1. The capacity of the (2,18,2) constraint is sufficient to allow a rational code rate of 2/5.

Figure 2:
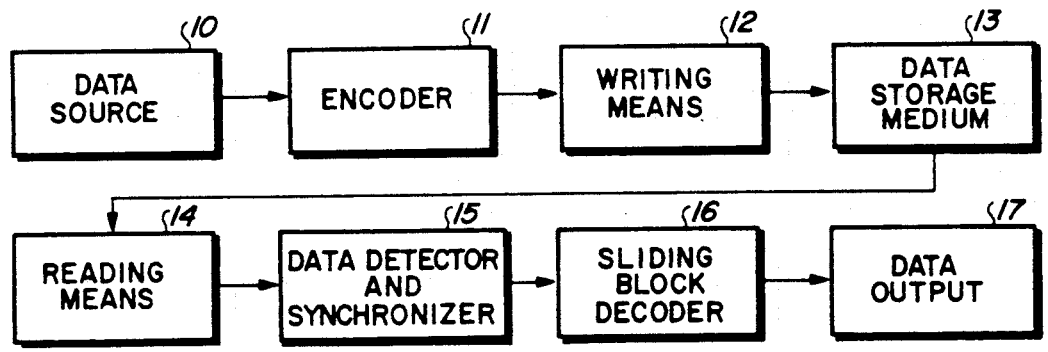
FIG. 2 is a block diagram of a data storage system embodying the invention.

FIG. 2 illustrates a data storage system employing a (2,18,2) code and embodying the invention. A binary data stream from a source 10 is converted into a (2,18,2) code bit stream by an encoder 11. The code bit stream controls a writing means 12, such as a diode laser and associated electronics in an optical disk system or a magnetic recording head and associated electronics in a magnetic disk or tape system. The information, as encoded into (2,18,2) code by encoder 11, is written onto a medium 13, such as an optical or magnetic disk in the form of marks in the case of optical media or magnetic transitions in the case of magnetic media. The written marks or transitions are read back as an analog signal by a reading means 14, which may include a laser beam or magnetic reading head. This analog signal is converted back into a digital data stream representing the code data by a data detector and synchronizer 15 that is suitable for codes with even consecutive zeros and may be of the type described in the proceedings of the IEEE International Conference on Communications, Apr. 16-19, 1990, at pages 1729-1733. The data output of data detector and synchronizer 15 is decoded by a decoder 16 which converts the (2,18,2) code data back to the original binary representation.

An algorithm for sliding block codes is described in IEEE Transactions on Information Theory, published Jan. 1983 at pp. 5-22. This algorithm is described in more condensed form in IEEE Transactions on Magnetics, published Sep. 1985, at pp. 1348-1349. These articles describe state-splitting and state-merging.

Figure 1:
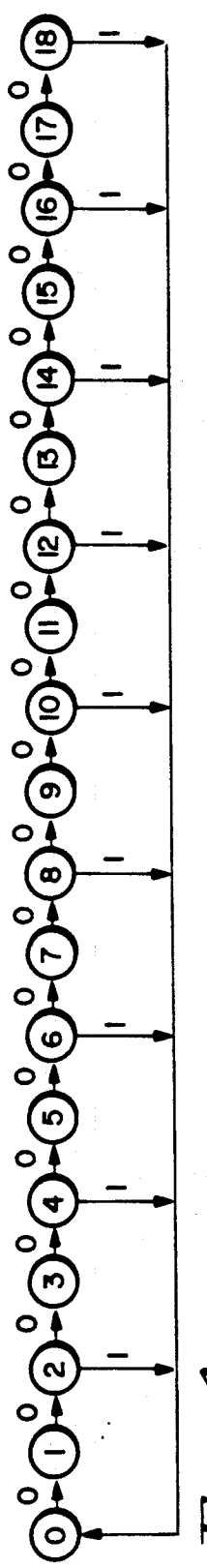
FIG. 1 is a finite state transition diagram depicting the (2,18,2) code.

According to a feature of the invention, applicants found that, by manipulation of the finite state transition diagram of FIG. 1 for the (2,18,2) code and making selective use of state-splitting methods, a finite state machine (FSM) with only 25 states and four outgoing edges per state could be used to define the (2,18,2) encoding algorithm. This FSM is depicted in Table 1 (see Appendix). It describes the encoding rules used by encoder 11 and, because of its simplicity, allows practical implementation of a (2,18,2) code.

Each edge of the FSM is represented by an entry in Table 1. Edges are selected during the encoding process according to the current state of the FSM and a two-bit input label. Each edge specifies a five-bit codeword and next state of the FSM. Encoded data is produced by tracing a path through the FSM. With each new set of two input bits, the correct edge is chosen from the current state and the codeword associated with the edge is output by encoder 11.

Thus, two bits of input data and the current state of the FSM serve to specify the five-bit codeword plus the next state of the FSM. Note that there are only 8 possible choices of codewords: 00000, 00001, 00010, 00100, 01000, 10000, 01001 and 10010.

The FSM in Table 1 was generated with only four rounds of state-splitting, which together with selective input edge assignment, enabled the design of a decoder having a window of only four codewords, an important feature of the invention. This limits error propagation upon decoding to eight bits. The two-bit input labels for each edge in Table 1 are chosen so as to allow unique decoding by a sliding block decoder.

Figure 3:
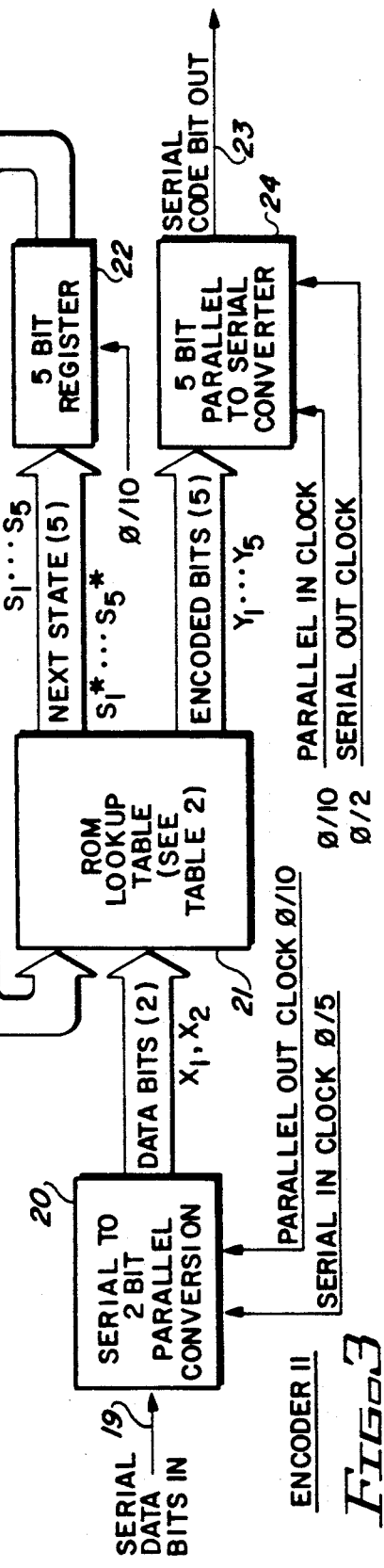
FIG. 3 is a block diagram of the encoder.

FIG. 3 illustrates the manner in which the FSM described in Table 1 can be implemented in hardware. Since the FSM has 25 states, at least five bits are required to represent a particular one of the states. The five state bits are identified as $s_1, \ldots, s_5$ and the two input data bits as $x_1$ and $x_2$. These seven bits generate the codeword $y_1, \ldots, y_5$ and the next state $s_1^*, \ldots, s_5^*$. The clock $\Phi$ has a frequency that is five times higher than the bit rate of the input data stream and twice the bit rate of the code data. The other clocks, $\Phi/2$, $\Phi/5$ and $\Phi/10$, are derived from $\Phi$ by frequency division by suitable means (not shown).

In encoder 11, serial input data 19 is converted to two parallel bits $x_1,x_2$ by a serial-to-parallel converter 20 which may be a serial-in, parallel-out shift register. The two parallel data bits $x_1$ and $x_2$ plus five state bits $s_1, \ldots, s_5$ that identify the present state of encoder 11 are supplied to, and specify the address of a memory location in, a read only memory (ROM) 21. ROM 21 serves as a look-up table to generate the codeword bits $y_1, \ldots, y_5$ and the bits $s_1^*, \ldots, s_5^*$ describing the next state of encoder 11. Register 22 holds the value of the current state of the FSM while the next state and codeword are generated. The codeword bits $y_1, \ldots, y_5$ are converted into a serial data stream 23 by parallel-to-serial converter 24 which may be a parallel-in, serial-out shift register. The encoding rules for the (2,18,2) encoder 11 can be converted into a truth table such as specified in Table 2 (see Appendix) by assigning a unique binary label to each state.

As illustrated, Table 2 specifies the contents of ROM 21 for the case where states $1, \ldots, 25$ of the FSM have been assigned the binary values $00001, \ldots, 11001$; however, any other consistent assignment of binary values to FSM state labels may be used, if preferred.

If desired, the truth table in Table 2 can also be converted into logic equations using standard logic minimization techniques. ROM 21 can then be replaced by suitable combinational logic circuitry. For example, the logic expression for $y_1$ would be $$y_1 = x_1 x_2 s_1 s_4 \bar{s}_5 + s_1 \bar{s}_2 \bar{s}_4 s_5 + s_1 s_3 \bar{s}_4 + s_1 \bar{s}_3 s_4.$$

Figure 4:
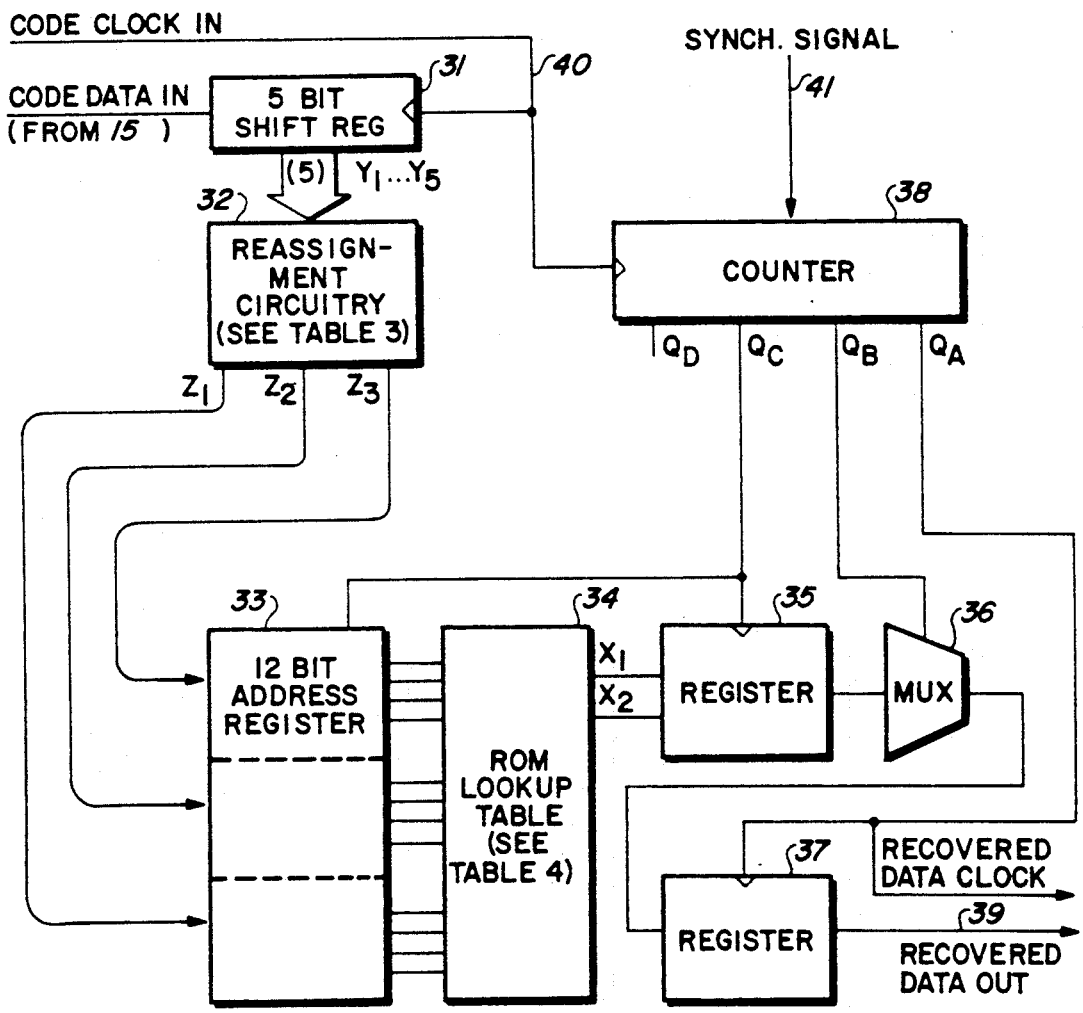
FIG. 4 is a block diagram of the decoder.

Referring now to FIG. 4, decoder 16 for the (2,18,2) code uses a sliding window to convert five-bit codewords $y_1, \ldots, y_5$ back to the correct two-bit sequences $x_1,x_2$, representing the recovered data. The input data stream for decoder 16 consists of concatenated five-bit codewords. In order to determine $x_1,x_2$, the current codeword and the three following codewords must be examined. Decoder 16 looks at a window of four five-bit codewords (a total of 20 bits) and produces the correct translation of the first one. When five new code bits are received, the window shifts forward one codeword and the process repeats. Although the decoder window is 20-bits wide, the same information, according to an important feature of the invention, desirably can be conveyed in a 12-bit form by adopting the codeword reassignment shown in Table 3 (see Appendix) to produce the logic equation $z_1=y_1+y_2$; $z_2=y_1+y_4+y_3$; $z_3=y_5+y_3+(y_1y_4)$. This is possible since there are only eight different five-bit codewords output by encoder 11. These five-bit codewords $y_1, \ldots, y_5$ are reassigned the smaller three-bit label $z_1,z_2,z_3$ when received. These three-bit codewords are then used to form the needed window of four words, resulting in only 12 bits total. This reduction from 20 bits to 12 bits greatly reduces the size the circuitry used to determine recovered data bits.

More specifically, and as illustrated in FIG. 4, shift register 31 receives encoded data serially from data detector and synchronizer 15 and presents it in parallel to combinational codeword reassignment logic circuitry 32. Circuitry 32 receives five-bit codeword $y_1, \ldots, y_5$ in parallel and converts it to a new three-bit representation $z_1, \ldots, z_3$, as specified in Table 3. These three-bit codewords are made available in parallel to a twelve-bit address register 33. Address register 33 comprises three four-bit shift registers. Every fifth clock cycle a new codeword $z_1,z_2,z_3$ is shifted into address register 33; with $z_1$ going to the first shift register, $z_2$ to the second, and $z_3$ to the third. These shift registers are four bits wide, so together they hold twelve bits of window information. This twelve-bit window addresses a look-up table in a ROM 34. The output of ROM 34 is the two bits $x_1,x_2$ decoded from the current codeword. These bits $x_1,x_2$ are then serialized through a register 35, multiplexor 36 and register 37 to provide recovered serial binary data in line 39.

The control signals for decoder 16 are all generated from outputs QA,QB,QC from a counter 38 in response to clock pulses in line 40. Output QC is used to load new three-bit reassigned codewords into address register 33. Output QC also clocks $x_1,x_2$ pairs into register 35 where they can be held while serialized out through the combination of multiplexor 36 and register 37. Output QB is an input to the multiplexor which selects between $x_1$ and $x_2$, thus determining which data is being fed to register 37. Output QA serves as the output data clock and controls the clocking of data from the multiplexor into register 37.

Figure 5:
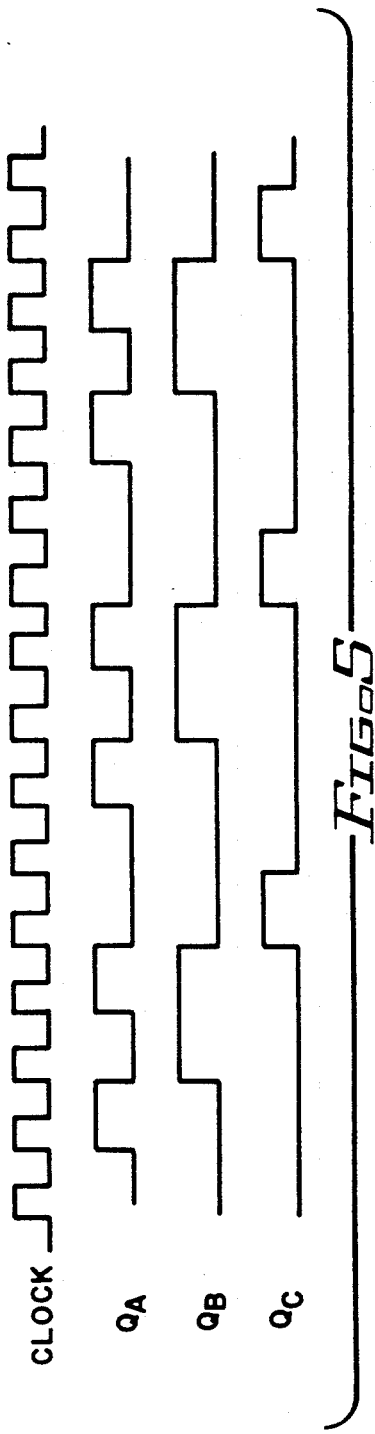
FIG. 5 is a timing diagram of the control signals for the decoder.

The relationship between these control signals is shown in FIG. 5. The serial output issues with an asymmetrical clock having two output pulses for every five code clock pulses (as required for a rate 2/5 code). Counter 38 relies on the synchronization signal in line 41 to correctly align the decoder window. This synchronization signal is generated from a preamble that initiates the data stream.

The contents of ROM 34 (shown in Table 4 of Appendix) are key to the operation of decoder 16. The look-up table was derived by considering all possible four codeword sequences generated by the encoder FSM, and choosing the correct x1,x2 for recovery in each case. There are a total of 100 edges (25 states×4 edges per state) in encoder 11. In some cases, there are identical codeword sequences (also called edge sequences) that begin in different states. Each sequence begins with a different edge, but must decode to the same input if decoding is to be unique.

The encoder FSM in Table 1 was designed with input assignments that allow these equivalent edge sequences to decode to the same x1,x2. The look-up truth table in Table 4 is written in terms of the three-bit codeword names or representations as reassigned in Table 3. The entries are written left to right with the oldest codeword (the one to be translated) at the left and the three following codewords (needed for the decoding window) to the right. When a new codeword is received, it shifts into the window from the right, as the oldest word (now decoded) shifts out to the left.

While the truth tables of Tables 2 and 4 were illustrated as implemented using ROMs 21 and 34, respectively, it will be understood that, if preferred, they may be implemented either in discrete logic circuitry or programmable logic arrays.

While the invention has been shown and described with respect to preferred embodiments thereof, it will be understood by those skilled in the art that changes in form and detail may be made in these embodiments without departing from the scope and teaching of the invention. Accordingly, the apparatus and method herein disclosed are to be considered merely as illustrative, and the invention is to be limited only as specified in the claims.

TABLE 1

Finite State Machine for (2.18.2) Encoder

| Current State | INPUT DATA | | | |
|---|---|---|---|---|
| | 00 * ** | 01 * ** | 10 * ** | 11 * ** |
| 01 | 04-00100 | 17-00100 | 18-00100 | 19-00100 |
| 02 | 06-00100 | 20-00100 | 21-00100 | 22-00100 |
| 03 | 01-00100 | 02-00100 | 03-00100 | 05-00100 |
| 04 | 13-00000 | 14-00000 | 15-00000 | 16-00000 |
| 05 | 08-00000 | 11-00000 | 23-00000 | 10-00000 |
| 06 | 04-00001 | 05-00001 | 06-00001 | 07-00001 |
| 07 | 01-00001 | 02-00001 | 03-00001 | 09-00001 |
| 08 | 13-01000 | 14-01000 | 15-01000 | 16-01000 |
| 09 | 04-00000 | 17-00000 | 18-00000 | 19-00000 |
| 10 | 20-00000 | 21-00000 | 06-00000 | 22-00000 |
| 11 | 08-01000 | 10-01000 | 11-01000 | 23-01000 |
| 12 | 01-00000 | 02-00000 | 03-00000 | 24-00000 |
| 13 | 13-00010 | 14-00010 | 15-00010 | 16-00010 |
| 14 | 09-00010 | 10-00010 | 11-00010 | 12-00010 |
| 15 | 01-01001 | 02-01001 | 03-01001 | 08-00010 |
| 16 | 04-01001 | 05-01001 | 06-01001 | 07-01001 |
| 17 | 04-10000 | 17-10000 | 18-10000 | 19-10000 |
| 18 | 06-10000 | 20-10000 | 21-10000 | 22-10000 |
| 19 | 01-10000 | 02-10000 | 03-10000 | 05-10000 |
| 20 | 09-10010 | 10-10010 | 11-10010 | 12-10010 |
| 21 | 13-10010 | 14-10010 | 15-10010 | 16-10010 |
| 22 | 01-00001 | 02-00001 | 03-00001 | 08-10010 |
| 23 | 01-00000 | 02-00000 | 03-00000 | 09-01000 |
| 24 | 08-00000 | 11-00000 | 23-00000 | 25-00000 |
| 25 | 20-00000 | 21-00000 | 18-00000 | 19-00000 |

*next state
**code word

TABLE 2

Truth TABLE for Finite State Machine for (2.18.2) Decoder

| 00 | 00001 | 00100 | 00100 |
|---|---|---|---|
| 01 | 00001 | 10001 | 00100 |

TABLE 2-continued

Truth TABLE for Finite State Machine for (2.18.2) Decoder

| 10 | 00001 | 10010 | 00100 |
|---|---|---|---|
| 11 | 00001 | 10011 | 00100 |
| 00 | 00010 | 00110 | 00100 |
| 01 | 00010 | 10100 | 00100 |
| 10 | 00010 | 10101 | 00100 |
| 11 | 00010 | 10110 | 00100 |
| 00 | 00011 | 00001 | 00100 |
| 01 | 00011 | 00010 | 00100 |
| 10 | 00011 | 00011 | 00100 |
| 11 | 00011 | 00101 | 00100 |
| 00 | 00100 | 01101 | 00000 |
| 01 | 00100 | 01110 | 00000 |
| 10 | 00100 | 01111 | 00000 |
| 11 | 00100 | 10000 | 00000 |
| 00 | 00101 | 01000 | 00000 |
| 01 | 00101 | 01011 | 00000 |
| 10 | 00101 | 10111 | 00000 |
| 11 | 00101 | 01010 | 00000 |
| 00 | 00110 | 00100 | 00001 |
| 01 | 00110 | 00101 | 00001 |
| 10 | 00110 | 00110 | 00001 |
| 11 | 00110 | 00111 | 00001 |
| 00 | 00111 | 00001 | 00001 |
| 01 | 00111 | 00010 | 00001 |
| 10 | 00111 | 00011 | 00001 |
| 11 | 00111 | 01001 | 00000 |
| 00 | 01000 | 01101 | 01000 |
| 01 | 01000 | 01110 | 01000 |
| 10 | 01000 | 01111 | 01000 |
| 11 | 01000 | 10000 | 01000 |
| 00 | 01001 | 00100 | 00000 |
| 01 | 01001 | 10001 | 00000 |
| 10 | 01001 | 10010 | 00000 |
| 11 | 01001 | 10011 | 00000 |
| 00 | 01010 | 10100 | 00000 |
| 01 | 01010 | 10101 | 00000 |
| 10 | 01010 | 00110 | 00000 |
| 11 | 01010 | 10110 | 00000 |
| 00 | 01011 | 01000 | 01000 |
| 01 | 01011 | 01010 | 01000 |
| 10 | 01011 | 01011 | 01000 |
| 11 | 01011 | 10111 | 01000 |
| 00 | 01100 | 00001 | 00000 |
| 01 | 01100 | 00010 | 00000 |
| 10 | 01100 | 00011 | 00000 |
| 11 | 01100 | 11000 | 00000 |
| 00 | 01101 | 01101 | 00010 |
| 01 | 01101 | 01110 | 00010 |
| 10 | 01101 | 01111 | 00010 |
| 11 | 01101 | 10000 | 00010 |
| 00 | 01110 | 01001 | 00010 |
| 01 | 01110 | 01010 | 00010 |
| 10 | 01110 | 01011 | 00010 |
| 11 | 01110 | 01100 | 00010 |
| 00 | 01111 | 00001 | 01001 |
| 01 | 01111 | 00010 | 01001 |
| 10 | 01111 | 00011 | 01001 |
| 11 | 01111 | 01000 | 00010 |
| 00 | 10000 | 00100 | 01001 |
| 01 | 10000 | 00101 | 01001 |
| 10 | 10000 | 00110 | 01001 |
| 11 | 10000 | 00111 | 01001 |
| 00 | 10001 | 00100 | 10000 |
| 01 | 10001 | 10001 | 10000 |
| 10 | 10001 | 10010 | 10000 |
| 11 | 10001 | 10011 | 10000 |
| 00 | 10010 | 00110 | 10000 |
| 01 | 10010 | 10100 | 10000 |
| 10 | 10010 | 10101 | 10000 |
| 11 | 10010 | 10110 | 10000 |
| 00 | 10011 | 00001 | 10000 |
| 01 | 10011 | 00010 | 10000 |
| 10 | 10011 | 00011 | 10000 |
| 11 | 10011 | 00101 | 10000 |
| 00 | 10100 | 01001 | 10010 |
| 01 | 10100 | 01010 | 10010 |
| 10 | 10100 | 01011 | 10010 |
| 11 | 10100 | 01100 | 10010 |
| 00 | 10101 | 01101 | 10010 |
| 01 | 10101 | 01110 | 10010 |
| 10 | 10101 | 01111 | 10010 |

TABLE 2-continued
Truth TABLE for Finite State Machine for (2.18.2) Decoder

| | | | |
|---|---|---|---|
| 11 | 10101 | 10000 | 10010 |
| 00 | 10110 | 00001 | 00001 |
| 01 | 10110 | 00010 | 00001 |
| 10 | 10110 | 00011 | 00001 |
| 11 | 10110 | 01000 | 10010 |
| 00 | 10111 | 00001 | 00000 |
| 01 | 10111 | 00010 | 00000 |
| 10 | 10111 | 00011 | 00000 |
| 11 | 10111 | 01001 | 01000 |
| 00 | 11000 | 01000 | 00000 |
| 01 | 11000 | 01011 | 00000 |
| 10 | 11000 | 10111 | 00000 |
| 11 | 11000 | 11001 | 00000 |
| 00 | 11001 | 10100 | 00000 |
| 01 | 11001 | 10101 | 00000 |
| 10 | 11001 | 10010 | 00000 |
| 11 | 11001 | 10011 | 00000 |

TABLE 3
Codeword Reassignment

| Codeword $y_1y_2y_3y_4y_5$ | Reassigned Word $z_1z_2z_3$ |
|---|---|
| 00000 | 000 |
| 00001 | 001 |
| 00010 | 010 |
| 00100 | 011 |
| 01000 | 100 |
| 01001 | 101 |
| 10000 | 110 |
| 10010 | 111 |

Logic Equation $z_1 = y_1 + y_2$
$z_2 = y_1 + y_4 + y_3$
$z_3 = y_5 + y_3 + (y_1y_4)$

TABLE 4
(2.18.2) Look-up Truth TABLE for (2.18.2) Decoder

| Input | | | | Output |
|---|---|---|---|---|
| $Z_1Z_2Z_3$ | $Z_1Z_2Z_3$ | $Z_1Z_2Z_3$ | $Z_1Z_2Z_3$ | $X_1X_2$ |
| [1] | [2] | [3] | [4] | |
| 0 0 0 | 1 1 1 | 1 0 1 | 0 0 1 | 0 1 |
| 0 0 0 | 1 1 1 | 1 0 1 | 0 0 0 | 0 1 |
| 0 0 0 | 1 1 1 | 0 1 0 | 1 0 0 | 0 1 |
| 0 0 0 | 1 1 1 | 1 0 1 | 0 1 1 | 0 1 |
| 0 0 0 | 1 1 1 | 0 1 0 | 0 0 0 | 0 1 |
| 0 0 0 | 1 1 1 | 0 1 0 | 1 0 1 | 0 1 |
| 0 0 0 | 1 1 1 | 0 1 0 | 0 1 0 | 0 1 |
| 0 0 0 | 1 1 1 | 0 0 0 | 0 0 0 | 0 0 |
| 0 0 0 | 1 1 1 | 0 0 0 | 0 1 1 | 0 0 |
| 0 0 0 | 1 1 1 | 1 0 0 | 0 0 0 | 0 0 |
| 0 0 0 | 1 1 1 | 1 0 0 | 1 0 0 | 0 0 |
| 0 0 0 | 1 1 1 | 0 0 0 | 0 0 1 | 0 0 |
| 0 0 0 | 1 1 1 | 0 0 0 | 1 1 1 | 0 0 |
| 0 0 0 | 1 1 1 | 0 0 0 | 1 1 0 | 0 0 |
| 0 0 0 | 1 1 0 | 0 0 0 | 0 0 0 | 1 1 |
| 0 0 0 | 1 1 0 | 0 0 0 | 1 0 0 | 1 1 |
| 0 0 0 | 1 1 0 | 0 1 1 | 0 0 0 | 1 1 |
| 0 0 0 | 1 1 0 | 0 1 1 | 0 1 1 | 1 1 |
| 0 0 0 | 1 1 0 | 0 1 1 | 0 0 1 | 1 1 |
| 0 0 0 | 1 1 0 | 0 1 1 | 1 1 1 | 1 1 |
| 0 0 0 | 1 1 0 | 0 1 1 | 1 1 0 | 1 1 |
| 0 0 0 | 1 1 0 | 1 1 1 | 1 0 0 | 1 0 |
| 0 0 0 | 1 1 0 | 0 0 1 | 0 1 1 | 1 0 |
| 0 0 0 | 1 1 0 | 1 1 1 | 1 0 1 | 1 0 |
| 0 0 0 | 1 1 0 | 1 1 1 | 0 1 0 | 1 0 |
| 0 0 0 | 1 1 0 | 1 1 1 | 0 0 0 | 1 0 |
| 0 0 0 | 1 1 0 | 0 0 1 | 0 0 1 | 1 0 |
| 0 0 0 | 1 1 0 | 0 0 1 | 0 0 0 | 1 0 |
| 0 0 0 | 0 0 0 | 1 1 1 | 1 0 1 | 1 1 |
| 0 0 0 | 0 0 0 | 1 1 1 | 0 1 0 | 1 1 |
| 0 0 0 | 0 0 0 | 1 1 1 | 0 0 0 | 1 1 |
| 0 0 0 | 0 0 0 | 1 1 1 | 1 0 0 | 1 1 |
| 0 0 0 | 0 0 0 | 1 1 0 | 0 0 0 | 1 1 |
| 0 0 0 | 0 0 0 | 1 1 0 | 0 1 1 | 1 1 |
| 0 0 0 | 0 0 0 | 1 1 0 | 0 0 1 | 1 1 |

TABLE 4-continued
(2.18.2) Look-up Truth TABLE for (2.18.2) Decoder

| Input | | | | Output |
|---|---|---|---|---|
| $Z_1Z_2Z_3$ | $Z_1Z_2Z_3$ | $Z_1Z_2Z_3$ | $Z_1Z_2Z_3$ | $X_1X_2$ |
| 0 0 0 | 0 0 0 | 1 1 0 | 1 1 1 | 1 1 |
| 0 0 0 | 1 0 0 | 0 0 0 | 1 1 0 | 1 0 |
| 0 0 0 | 1 0 0 | 0 0 0 | 0 0 0 | 1 0 |
| 0 0 0 | 0 0 0 | 0 1 1 | 0 0 0 | 1 0 |
| 0 0 0 | 0 0 0 | 0 1 1 | 0 1 1 | 1 0 |
| 0 0 0 | 0 0 0 | 0 1 1 | 0 0 1 | 1 0 |
| 0 0 0 | 0 0 0 | 0 1 1 | 1 1 1 | 1 0 |
| 0 0 0 | 0 0 0 | 0 1 1 | 1 1 0 | 1 0 |
| 0 0 0 | 1 0 0 | 1 0 0 | 0 0 0 | 0 1 |
| 0 0 0 | 1 0 0 | 0 0 0 | 0 1 1 | 0 1 |
| 0 0 0 | 1 0 0 | 1 0 0 | 1 0 0 | 0 1 |
| 0 0 0 | 1 0 0 | 0 0 0 | 0 0 1 | 0 1 |
| 0 0 0 | 1 0 0 | 0 0 0 | 1 1 1 | 0 1 |
| 0 0 0 | 1 0 0 | 1 0 0 | 1 0 1 | 0 1 |
| 0 0 0 | 1 0 0 | 1 0 0 | 0 1 0 | 0 1 |
| 0 0 0 | 1 0 0 | 1 0 1 | 0 0 1 | 0 0 |
| 0 0 0 | 1 0 0 | 1 0 1 | 0 0 0 | 0 0 |
| 0 0 0 | 1 0 0 | 0 1 0 | 1 0 0 | 0 0 |
| 0 0 0 | 1 0 0 | 1 0 1 | 0 1 1 | 0 0 |
| 0 0 0 | 1 0 0 | 0 1 0 | 0 0 0 | 0 0 |
| 0 0 0 | 1 0 0 | 0 1 0 | 1 0 1 | 0 0 |
| 0 0 0 | 1 0 0 | 0 1 0 | 0 1 0 | 0 0 |
| 1 0 0 | 0 0 0 | 1 1 0 | 0 0 0 | 1 1 |
| 1 0 0 | 0 0 0 | 1 1 0 | 0 1 1 | 1 1 |
| 1 0 0 | 0 0 0 | 1 1 0 | 0 0 1 | 1 1 |
| 1 0 0 | 0 0 0 | 1 1 0 | 1 1 1 | 1 1 |
| 1 0 0 | 0 0 0 | 1 1 0 | 1 1 0 | 1 1 |
| 1 0 0 | 0 0 0 | 0 0 0 | 1 0 1 | 1 1 |
| 1 0 0 | 0 0 0 | 0 0 0 | 0 1 0 | 1 1 |
| 1 0 0 | 0 1 1 | 0 0 0 | 0 0 0 | 1 0 |
| 0 0 0 | 0 1 1 | 0 0 0 | 1 0 0 | 1 0 |
| 0 0 0 | 0 1 1 | 0 1 1 | 0 0 0 | 1 0 |
| 0 0 0 | 0 1 1 | 0 1 1 | 0 1 1 | 1 0 |
| 0 0 0 | 0 1 1 | 0 1 1 | 0 0 1 | 1 0 |
| 0 0 0 | 0 1 1 | 0 1 1 | 1 1 1 | 1 0 |
| 0 0 0 | 0 1 1 | 0 1 1 | 1 1 0 | 1 0 |
| 0 0 0 | 0 1 1 | 1 1 1 | 1 0 0 | 0 1 |
| 0 0 0 | 0 1 1 | 0 0 1 | 0 1 1 | 0 1 |
| 0 0 0 | 0 1 1 | 1 1 1 | 1 0 1 | 0 1 |
| 0 0 0 | 0 1 1 | 1 1 1 | 0 1 0 | 0 1 |
| 0 0 0 | 0 1 1 | 1 1 1 | 0 0 0 | 0 1 |
| 0 0 0 | 0 1 1 | 0 0 1 | 0 0 1 | 0 1 |
| 0 0 0 | 0 1 1 | 0 0 1 | 0 0 0 | 0 1 |
| 0 0 0 | 0 1 1 | 1 1 0 | 0 0 0 | 0 0 |
| 0 0 0 | 0 1 1 | 1 1 0 | 0 1 1 | 0 0 |
| 0 0 0 | 0 1 1 | 1 1 0 | 0 0 1 | 0 0 |
| 0 0 0 | 0 1 1 | 1 1 0 | 1 1 1 | 0 0 |
| 0 0 0 | 0 1 1 | 1 1 0 | 1 1 0 | 0 0 |
| 0 0 0 | 0 1 1 | 0 0 0 | 1 0 1 | 0 0 |
| 0 0 0 | 0 1 1 | 0 0 0 | 0 1 0 | 0 0 |
| 1 1 1 | 1 0 0 | 1 0 1 | 0 0 1 | 1 1 |
| 1 1 1 | 1 0 0 | 1 0 1 | 0 0 0 | 1 1 |
| 1 1 1 | 1 0 0 | 0 1 0 | 1 0 0 | 1 1 |
| 1 1 1 | 1 0 0 | 1 0 1 | 0 1 1 | 1 1 |
| 1 1 1 | 1 0 0 | 0 1 0 | 0 0 0 | 1 1 |
| 1 1 1 | 1 0 0 | 0 1 0 | 1 0 1 | 1 1 |
| 1 1 1 | 1 0 0 | 0 1 0 | 0 1 0 | 1 1 |
| 0 0 1 | 0 1 1 | 0 0 0 | 0 0 0 | 1 0 |
| 0 0 1 | 0 1 1 | 0 0 0 | 1 0 0 | 1 0 |
| 0 0 1 | 0 1 1 | 0 1 1 | 0 0 0 | 1 0 |
| 0 0 1 | 0 1 1 | 0 1 1 | 0 1 1 | 1 0 |
| 0 0 1 | 0 1 1 | 0 1 1 | 0 0 1 | 1 0 |
| 0 0 1 | 0 1 1 | 0 1 1 | 1 1 1 | 1 0 |
| 0 0 1 | 0 1 1 | 0 1 1 | 1 1 0 | 1 0 |
| 0 0 1 | 0 1 1 | 1 1 1 | 1 0 0 | 0 1 |
| 0 0 1 | 0 1 1 | 0 0 1 | 0 1 1 | 0 1 |
| 0 0 1 | 0 1 1 | 1 1 1 | 1 0 1 | 0 1 |
| 0 0 1 | 0 1 1 | 1 1 1 | 0 1 0 | 0 1 |
| 0 0 1 | 0 1 1 | 1 1 1 | 0 0 0 | 0 1 |
| 0 0 1 | 0 1 1 | 0 0 1 | 0 0 1 | 0 1 |
| 0 0 1 | 0 1 1 | 0 0 1 | 0 0 0 | 0 1 |
| 0 0 1 | 0 1 1 | 1 1 0 | 0 0 0 | 0 0 |
| 0 0 1 | 0 1 1 | 1 1 0 | 0 1 1 | 0 0 |
| 0 0 1 | 0 1 1 | 1 1 0 | 0 0 1 | 0 0 |
| 0 0 1 | 0 1 1 | 1 1 0 | 1 1 1 | 0 0 |
| 0 0 1 | 0 1 1 | 1 1 0 | 1 1 0 | 0 0 |
| 0 0 1 | 0 1 1 | 0 0 0 | 1 0 1 | 0 0 |
| 0 0 1 | 0 1 1 | 0 0 0 | 0 1 0 | 0 0 |

TABLE 4-continued
(2.18.2) Look-up Truth TABLE for (2.18.2) Decoder

| Input | | | | Output |
|---|---|---|---|---|
| $Z_1Z_2Z_3$ | $Z_1Z_2Z_3$ | $Z_1Z_2Z_3$ | $Z_1Z_2Z_3$ | $X_1X_2$ |
| 1 1 1 | 1 0 1 | 0 0 0 | 0 0 0 | 1 1 |
| 1 1 1 | 1 0 1 | 0 0 1 | 0 1 1 | 1 1 |
| 1 1 1 | 1 0 1 | 0 0 1 | 0 0 1 | 1 1 |
| 1 1 1 | 1 0 1 | 0 0 0 | 1 0 0 | 1 1 |
| 1 1 1 | 1 0 1 | 0 0 0 | 1 0 1 | 1 1 |
| 1 1 1 | 1 0 1 | 0 0 0 | 0 1 0 | 1 1 |
| 1 1 1 | 0 1 0 | 1 0 0 | 1 0 1 | 1 0 |
| 1 1 1 | 0 1 0 | 1 0 0 | 0 1 0 | 1 0 |
| 1 1 1 | 1 0 1 | 0 1 1 | 0 0 0 | 1 0 |
| 1 1 1 | 1 0 1 | 0 1 1 | 0 1 1 | 1 0 |
| 1 1 1 | 1 0 1 | 0 1 1 | 0 0 1 | 1 0 |
| 1 1 1 | 1 0 1 | 0 1 1 | 1 1 1 | 1 0 |
| 1 1 1 | 1 0 1 | 0 1 1 | 1 1 0 | 1 0 |
| 1 1 1 | 0 1 0 | 0 0 0 | 0 0 0 | 0 1 |
| 1 1 1 | 0 1 0 | 0 0 0 | 0 1 1 | 0 1 |
| 1 1 1 | 0 1 0 | 1 0 0 | 0 0 0 | 0 1 |
| 1 1 1 | 0 1 0 | 1 0 0 | 1 0 0 | 0 1 |
| 1 1 1 | 0 1 0 | 0 0 0 | 0 0 1 | 0 1 |
| 1 1 1 | 0 1 0 | 0 0 0 | 1 1 1 | 0 1 |
| 1 1 1 | 0 1 0 | 0 0 0 | 1 1 0 | 0 1 |
| 1 1 1 | 0 1 0 | 1 0 1 | 0 0 1 | 0 0 |
| 1 1 1 | 0 1 0 | 1 0 1 | 0 0 0 | 0 0 |
| 1 1 1 | 0 1 0 | 0 1 0 | 1 0 0 | 0 0 |
| 1 1 1 | 0 1 0 | 1 0 1 | 0 1 1 | 0 0 |
| 1 1 1 | 0 1 0 | 0 1 0 | 0 0 0 | 0 0 |
| 1 1 1 | 0 1 0 | 0 1 0 | 1 0 1 | 0 0 |
| 1 1 1 | 0 1 0 | 0 1 0 | 0 1 0 | 0 0 |
| 1 1 1 | 0 0 0 | 0 0 0 | 0 0 0 | 1 1 |
| 1 1 1 | 0 0 0 | 0 0 0 | 1 0 0 | 1 1 |
| 1 1 1 | 0 0 0 | 0 1 1 | 0 0 0 | 1 1 |
| 1 1 1 | 0 0 0 | 0 1 1 | 0 1 1 | 1 1 |
| 1 1 1 | 0 0 0 | 0 1 1 | 0 0 1 | 1 1 |
| 1 1 1 | 0 0 0 | 0 1 1 | 1 1 1 | 1 1 |
| 1 1 1 | 0 0 0 | 0 1 1 | 1 1 0 | 1 1 |
| 1 1 1 | 1 0 0 | 1 0 0 | 0 0 0 | 1 0 |
| 1 1 1 | 1 0 0 | 0 0 0 | 0 1 1 | 1 0 |
| 1 1 1 | 1 0 0 | 1 0 0 | 1 0 0 | 1 0 |
| 1 1 1 | 1 0 0 | 0 0 0 | 0 0 1 | 1 0 |
| 1 1 1 | 1 0 0 | 0 0 0 | 1 1 1 | 1 0 |
| 1 1 1 | 1 0 0 | 1 0 0 | 1 0 1 | 1 0 |
| 1 1 1 | 1 0 0 | 1 0 0 | 0 1 0 | 1 0 |
| 1 1 1 | 0 0 0 | 1 1 1 | 1 0 0 | 0 1 |
| 1 1 1 | 0 0 0 | 0 0 1 | 0 1 1 | 0 1 |
| 1 1 1 | 0 0 0 | 1 1 1 | 1 0 1 | 0 1 |
| 1 1 1 | 0 0 0 | 1 1 1 | 0 1 0 | 0 1 |
| 1 1 1 | 0 0 0 | 1 1 1 | 0 0 0 | 0 1 |
| 1 1 1 | 0 0 0 | 0 0 1 | 0 0 1 | 0 1 |
| 1 1 1 | 0 0 0 | 0 0 1 | 0 0 0 | 0 1 |
| 1 1 1 | 0 0 0 | 1 1 0 | 0 0 0 | 0 0 |
| 1 1 1 | 0 0 0 | 1 1 0 | 0 1 1 | 0 0 |
| 1 1 1 | 0 0 0 | 1 1 0 | 0 0 1 | 0 0 |
| 1 1 1 | 0 0 0 | 1 1 0 | 1 1 1 | 0 0 |
| 1 1 1 | 0 0 0 | 1 1 0 | 1 1 0 | 0 0 |
| 1 1 1 | 0 0 0 | 0 0 0 | 1 0 1 | 0 0 |
| 1 1 1 | 0 0 0 | 0 0 0 | 0 1 0 | 0 0 |
| 1 1 0 | 0 0 0 | 1 0 0 | 0 0 0 | 1 1 |
| 1 1 0 | 0 0 0 | 0 0 0 | 0 1 1 | 1 1 |
| 1 1 0 | 0 0 0 | 1 0 0 | 1 0 0 | 1 1 |
| 1 1 0 | 0 0 0 | 0 0 0 | 0 0 1 | 1 1 |
| 1 1 0 | 0 0 0 | 0 0 0 | 1 1 1 | 1 1 |
| 1 1 0 | 0 0 0 | 1 0 0 | 1 0 1 | 1 1 |
| 1 1 0 | 0 0 0 | 1 0 0 | 0 1 0 | 1 1 |
| 1 1 0 | 0 1 1 | 0 0 0 | 0 0 0 | 1 0 |
| 1 1 0 | 0 1 1 | 0 0 0 | 1 0 0 | 1 0 |
| 1 1 0 | 0 1 1 | 0 1 1 | 0 0 0 | 1 0 |
| 1 1 0 | 0 1 1 | 0 1 1 | 0 1 1 | 1 0 |
| 1 1 0 | 0 1 1 | 0 1 1 | 0 0 1 | 1 0 |
| 1 1 0 | 0 1 1 | 0 1 1 | 1 1 1 | 1 0 |
| 1 1 0 | 0 1 1 | 0 1 1 | 1 1 0 | 1 0 |
| 1 1 0 | 0 1 1 | 1 1 1 | 1 0 0 | 0 1 |
| 1 1 0 | 0 1 1 | 0 0 1 | 0 1 1 | 0 1 |
| 1 1 0 | 0 1 1 | 1 1 1 | 1 0 1 | 0 1 |
| 1 1 0 | 0 1 1 | 1 1 1 | 0 1 0 | 0 1 |
| 1 1 0 | 0 1 1 | 1 1 1 | 0 0 0 | 0 1 |
| 1 1 0 | 0 1 1 | 0 0 1 | 0 0 1 | 0 1 |
| 1 1 0 | 0 1 1 | 0 0 1 | 0 0 0 | 0 1 |
| 1 1 0 | 0 1 1 | 1 1 0 | 0 0 0 | 0 0 |
| 1 1 0 | 0 1 1 | 1 1 0 | 0 1 1 | 0 0 |
| 1 1 0 | 0 1 1 | 1 1 0 | 0 0 1 | 0 0 |
| 1 1 0 | 0 1 1 | 1 1 0 | 1 1 1 | 0 0 |
| 1 1 0 | 0 1 1 | 1 1 0 | 1 1 0 | 0 0 |
| 1 1 0 | 0 1 1 | 0 0 0 | 1 0 1 | 0 0 |
| 1 1 0 | 0 1 1 | 0 0 0 | 0 1 0 | 0 0 |
| 1 1 0 | 1 1 1 | 1 0 0 | 1 0 1 | 1 1 |
| 1 1 0 | 1 1 1 | 1 0 0 | 0 1 0 | 1 1 |
| 1 1 0 | 0 0 1 | 0 1 1 | 0 0 0 | 1 1 |
| 1 1 0 | 0 0 1 | 0 1 1 | 0 1 1 | 1 1 |
| 1 1 0 | 0 0 1 | 0 1 1 | 0 0 1 | 1 1 |
| 1 1 0 | 0 0 1 | 0 1 1 | 1 1 1 | 1 1 |
| 1 1 0 | 0 0 1 | 0 1 1 | 1 1 0 | 1 1 |
| 1 1 0 | 1 1 1 | 1 0 1 | 0 0 1 | 1 0 |
| 1 1 0 | 1 1 1 | 1 0 1 | 0 0 0 | 1 0 |
| 1 1 0 | 1 1 1 | 0 1 0 | 1 0 0 | 1 0 |
| 1 1 0 | 1 1 1 | 1 0 1 | 0 1 1 | 1 0 |
| 1 1 0 | 1 1 1 | 0 1 0 | 0 0 0 | 1 0 |
| 1 1 0 | 1 1 1 | 0 1 0 | 1 0 1 | 1 0 |
| 1 1 0 | 1 1 1 | 0 1 0 | 0 1 0 | 1 0 |
| 1 1 0 | 1 1 1 | 0 0 0 | 0 0 0 | 0 1 |
| 1 1 0 | 1 1 1 | 0 0 0 | 0 1 1 | 0 1 |
| 1 1 0 | 1 1 1 | 1 0 0 | 0 0 0 | 0 1 |
| 1 1 0 | 1 1 1 | 1 0 0 | 1 0 0 | 0 1 |
| 1 1 0 | 1 1 1 | 0 0 0 | 0 0 1 | 0 1 |
| 1 1 0 | 1 1 1 | 0 0 0 | 1 1 1 | 0 1 |
| 1 1 0 | 1 1 1 | 0 0 0 | 1 1 0 | 0 1 |
| 1 1 0 | 0 0 1 | 0 0 0 | 0 0 0 | 0 0 |
| 1 1 0 | 0 0 1 | 0 0 1 | 0 1 1 | 0 0 |
| 1 1 0 | 0 0 1 | 0 0 1 | 0 0 1 | 0 0 |
| 1 1 0 | 0 0 1 | 0 0 1 | 0 0 0 | 0 0 |
| 1 1 0 | 0 0 1 | 0 0 0 | 1 0 0 | 0 0 |
| 1 1 0 | 0 0 1 | 0 0 0 | 1 0 1 | 0 0 |
| 1 1 0 | 0 0 1 | 0 0 0 | 0 1 0 | 0 0 |
| 1 1 0 | 1 1 0 | 0 0 0 | 0 0 0 | 1 1 |
| 1 1 0 | 1 1 0 | 0 0 0 | 1 0 0 | 1 1 |
| 1 1 0 | 1 1 0 | 0 1 1 | 0 0 0 | 1 1 |
| 1 1 0 | 1 1 0 | 0 1 1 | 0 1 1 | 1 1 |
| 1 1 0 | 1 1 0 | 0 1 1 | 0 0 1 | 1 1 |
| 1 1 0 | 1 1 0 | 0 1 1 | 1 1 1 | 1 1 |
| 1 1 0 | 1 1 0 | 0 1 1 | 1 1 0 | 1 1 |
| 1 1 0 | 1 1 0 | 1 1 1 | 1 0 0 | 1 0 |
| 1 1 0 | 1 1 0 | 0 0 1 | 0 1 1 | 1 0 |
| 1 1 0 | 1 1 0 | 1 1 1 | 1 0 1 | 1 0 |
| 1 1 0 | 1 1 0 | 1 1 1 | 0 1 0 | 1 0 |
| 1 1 0 | 1 1 0 | 1 1 1 | 0 0 0 | 1 0 |
| 1 1 0 | 1 1 0 | 0 0 1 | 0 0 1 | 1 0 |
| 1 1 0 | 1 1 0 | 0 0 1 | 0 0 0 | 1 0 |
| 1 1 0 | 1 1 0 | 1 1 0 | 0 0 0 | 0 1 |
| 1 1 0 | 1 1 0 | 1 1 0 | 0 1 1 | 0 1 |
| 1 1 0 | 1 1 0 | 1 1 0 | 0 0 1 | 0 1 |
| 1 1 0 | 1 1 0 | 1 1 0 | 1 1 1 | 0 1 |
| 1 1 0 | 1 1 0 | 1 1 0 | 1 1 0 | 0 1 |
| 1 1 0 | 1 1 0 | 0 0 0 | 1 0 1 | 0 1 |
| 1 1 0 | 1 1 0 | 0 0 0 | 0 1 0 | 0 1 |
| 1 1 0 | 0 0 0 | 1 0 1 | 0 0 1 | 0 0 |
| 1 1 0 | 0 0 0 | 1 0 1 | 0 0 0 | 0 0 |
| 1 1 0 | 0 0 0 | 0 1 0 | 1 0 0 | 0 0 |
| 1 1 0 | 0 0 0 | 1 0 1 | 0 1 1 | 0 0 |
| 1 1 0 | 0 0 0 | 0 1 0 | 0 0 0 | 0 0 |
| 1 1 0 | 0 0 0 | 0 1 0 | 1 0 1 | 0 0 |
| 1 1 0 | 0 0 0 | 0 1 0 | 0 1 0 | 0 0 |
| 1 0 1 | 0 0 0 | 0 0 0 | 1 1 0 | 1 1 |
| 1 0 1 | 0 0 0 | 0 0 0 | 0 0 0 | 1 1 |
| 1 0 1 | 0 0 1 | 0 1 1 | 0 0 0 | 1 1 |
| 1 0 1 | 0 0 1 | 0 1 1 | 0 1 1 | 1 1 |
| 1 0 1 | 0 0 1 | 0 1 1 | 0 0 1 | 1 1 |
| 1 0 1 | 0 0 1 | 0 1 1 | 1 1 1 | 1 1 |
| 1 0 1 | 0 0 1 | 0 1 1 | 1 1 0 | 1 1 |
| 1 0 1 | 0 0 1 | 0 0 0 | 0 0 0 | 1 0 |
| 1 0 1 | 0 0 1 | 0 0 1 | 0 1 1 | 1 0 |
| 1 0 1 | 0 0 1 | 0 0 1 | 0 0 1 | 1 0 |
| 1 0 1 | 0 0 1 | 0 0 1 | 0 0 0 | 1 0 |
| 1 0 1 | 0 0 1 | 0 0 0 | 1 0 0 | 1 0 |
| 1 0 1 | 0 0 1 | 0 0 0 | 1 0 1 | 1 0 |
| 1 0 1 | 0 0 1 | 0 0 0 | 0 1 0 | 1 0 |
| 1 0 1 | 0 0 0 | 1 0 0 | 0 0 0 | 0 1 |
| 1 0 1 | 0 0 0 | 0 0 0 | 0 1 1 | 0 1 |

TABLE 4-continued (2.18.2) Look-up Truth TABLE for (2.18.2) Decoder

| Input | | | | Output |
|---|---|---|---|---|
| $Z_1Z_2Z_3$ | $Z_1Z_2Z_3$ | $Z_1Z_2Z_3$ | $Z_1Z_2Z_3$ | $X_1X_2$ |
| 1 0 1 | 0 0 0 | 1 0 0 | 1 0 0 | 0 1 |
| 1 0 1 | 0 0 0 | 0 0 0 | 0 0 1 | 0 1 |
| 1 0 1 | 0 0 0 | 0 0 0 | 1 1 1 | 0 1 |
| 1 0 1 | 0 0 0 | 1 0 0 | 1 0 1 | 0 1 |
| 1 0 1 | 0 0 0 | 1 0 0 | 0 1 0 | 0 1 |
| 1 0 1 | 0 0 0 | 1 0 1 | 0 0 1 | 0 0 |
| 1 0 1 | 0 0 0 | 1 0 1 | 0 0 0 | 0 0 |
| 1 0 1 | 0 0 0 | 0 1 0 | 1 0 0 | 0 0 |
| 1 0 1 | 0 0 0 | 1 0 1 | 0 1 1 | 0 0 |
| 1 0 1 | 0 0 0 | 0 1 0 | 0 0 0 | 0 0 |
| 1 0 1 | 0 0 0 | 0 1 0 | 1 0 1 | 0 0 |
| 1 0 1 | 0 0 0 | 0 1 0 | 0 1 0 | 0 0 |
| 0 1 0 | 1 0 0 | 1 0 1 | 0 0 1 | 1 1 |
| 0 1 0 | 1 0 0 | 1 0 1 | 0 0 0 | 1 1 |
| 0 1 0 | 1 0 0 | 0 1 0 | 1 0 0 | 1 1 |
| 0 1 0 | 1 0 0 | 1 0 1 | 0 1 1 | 1 1 |
| 0 1 0 | 1 0 0 | 0 1 0 | 0 0 0 | 1 1 |
| 0 1 0 | 1 0 0 | 0 1 0 | 1 0 1 | 1 1 |
| 0 1 0 | 1 0 0 | 0 1 0 | 0 1 0 | 1 1 |
| 1 0 1 | 0 1 1 | 0 0 0 | 0 0 0 | 1 0 |
| 1 0 1 | 0 1 1 | 0 0 0 | 1 0 0 | 1 0 |
| 1 0 1 | 0 1 1 | 0 1 1 | 0 0 0 | 1 0 |
| 1 0 1 | 0 1 1 | 0 1 1 | 0 1 1 | 1 0 |
| 1 0 1 | 0 1 1 | 0 1 1 | 0 0 1 | 1 0 |
| 1 0 1 | 0 1 1 | 0 1 1 | 1 1 1 | 1 0 |
| 1 0 1 | 0 1 1 | 0 1 1 | 1 1 0 | 1 0 |
| 1 0 1 | 0 1 1 | 1 1 1 | 1 0 0 | 0 1 |
| 1 0 1 | 0 1 1 | 0 0 1 | 0 1 1 | 0 1 |
| 1 0 1 | 0 1 1 | 1 1 1 | 1 0 1 | 0 1 |
| 1 0 1 | 0 1 1 | 1 1 1 | 0 1 0 | 0 1 |
| 1 0 1 | 0 1 1 | 1 1 1 | 0 0 0 | 0 1 |
| 1 0 1 | 0 1 1 | 0 0 1 | 0 0 1 | 0 1 |
| 1 0 1 | 0 1 1 | 0 0 1 | 0 0 0 | 0 1 |
| 1 0 1 | 0 1 1 | 1 1 0 | 0 0 0 | 0 0 |
| 1 0 1 | 0 1 1 | 1 1 0 | 0 1 1 | 0 0 |
| 1 0 1 | 0 1 1 | 1 1 0 | 0 0 1 | 0 0 |
| 1 0 1 | 0 1 1 | 1 1 0 | 1 1 1 | 0 0 |
| 1 0 1 | 0 1 1 | 1 1 0 | 1 1 0 | 0 0 |
| 1 0 1 | 0 1 1 | 0 0 0 | 1 0 1 | 0 0 |
| 1 0 1 | 0 1 1 | 0 0 0 | 0 1 0 | 0 0 |
| 0 1 0 | 0 0 0 | 0 0 0 | 0 0 0 | 1 1 |
| 0 1 0 | 0 0 0 | 0 0 0 | 1 0 0 | 1 1 |
| 0 1 0 | 0 0 0 | 0 1 1 | 0 0 0 | 1 1 |
| 0 1 0 | 0 0 0 | 0 1 1 | 0 1 1 | 1 1 |
| 0 1 0 | 0 0 0 | 0 1 1 | 0 0 1 | 1 1 |
| 0 1 0 | 0 0 0 | 0 1 1 | 1 1 1 | 1 1 |
| 0 1 0 | 0 0 0 | 0 1 1 | 1 1 0 | 1 1 |
| 0 1 0 | 1 0 0 | 1 0 0 | 0 0 0 | 1 0 |
| 0 1 0 | 1 0 0 | 0 0 0 | 0 1 1 | 1 0 |
| 0 1 0 | 1 0 0 | 1 0 0 | 1 0 0 | 1 0 |
| 0 1 0 | 1 0 0 | 0 0 0 | 0 0 1 | 1 0 |
| 0 1 0 | 1 0 0 | 0 0 0 | 1 1 1 | 1 0 |
| 0 1 0 | 1 0 0 | 1 0 0 | 1 0 1 | 1 0 |
| 0 1 0 | 1 0 0 | 1 0 0 | 0 1 0 | 1 0 |
| 0 1 0 | 0 0 0 | 1 1 1 | 1 0 0 | 0 1 |
| 0 1 0 | 0 0 0 | 0 0 1 | 0 1 1 | 0 1 |
| 0 1 0 | 0 0 0 | 1 1 1 | 1 0 1 | 0 1 |
| 0 1 0 | 0 0 0 | 1 1 1 | 0 1 0 | 0 1 |
| 0 1 0 | 0 0 0 | 1 1 1 | 0 0 0 | 0 1 |
| 0 1 0 | 0 0 0 | 0 0 1 | 0 0 1 | 0 1 |
| 0 1 0 | 0 0 0 | 0 0 1 | 0 0 0 | 0 1 |
| 0 1 0 | 0 0 0 | 1 1 0 | 0 0 0 | 0 0 |
| 0 1 0 | 0 0 0 | 1 1 0 | 0 1 1 | 0 0 |
| 0 1 0 | 0 0 0 | 1 1 0 | 0 0 1 | 0 0 |
| 0 1 0 | 0 0 0 | 1 1 0 | 1 1 1 | 0 0 |
| 0 1 0 | 0 0 0 | 1 1 0 | 1 1 0 | 0 0 |
| 0 1 0 | 0 0 0 | 0 0 0 | 1 0 1 | 0 0 |
| 0 1 0 | 0 0 0 | 0 0 0 | 0 1 0 | 0 0 |
| 0 1 0 | 1 0 1 | 0 0 0 | 0 0 0 | 1 1 |
| 0 1 0 | 1 0 1 | 0 0 1 | 0 1 1 | 1 1 |
| 0 1 0 | 1 0 1 | 0 0 1 | 0 0 1 | 1 1 |
| 0 1 0 | 1 0 1 | 0 0 1 | 0 0 0 | 1 1 |
| 0 1 0 | 1 0 1 | 0 0 0 | 1 0 0 | 1 1 |
| 0 1 0 | 1 0 1 | 0 0 0 | 1 0 1 | 1 1 |
| 0 1 0 | 1 0 1 | 0 0 0 | 0 1 0 | 1 1 |
| 0 1 0 | 0 1 0 | 1 0 0 | 1 0 1 | 1 0 |
| 0 1 0 | 0 1 0 | 1 0 0 | 0 1 0 | 1 0 |
| 0 1 0 | 1 0 1 | 0 1 1 | 0 0 0 | 1 0 |
| 0 1 0 | 1 0 1 | 0 1 1 | 0 1 1 | 1 0 |
| 0 1 0 | 1 0 1 | 0 1 1 | 0 0 1 | 1 0 |
| 0 1 0 | 1 0 1 | 0 1 1 | 1 1 1 | 1 0 |
| 0 1 0 | 1 0 1 | 0 1 1 | 1 1 0 | 1 0 |
| 0 1 0 | 0 1 0 | 0 0 0 | 0 0 0 | 0 1 |
| 0 1 0 | 0 1 0 | 0 0 0 | 0 1 1 | 0 1 |
| 0 1 0 | 0 1 0 | 1 0 0 | 0 0 0 | 0 1 |
| 0 1 0 | 0 1 0 | 1 0 0 | 1 0 0 | 0 1 |
| 0 1 0 | 0 1 0 | 0 0 0 | 0 0 1 | 0 1 |
| 0 1 0 | 0 1 0 | 0 0 0 | 1 1 1 | 0 1 |
| 0 1 0 | 0 1 0 | 0 0 0 | 1 1 0 | 0 1 |
| 0 1 0 | 0 1 0 | 1 0 1 | 0 0 1 | 0 0 |
| 0 1 0 | 0 1 0 | 1 0 1 | 0 0 0 | 0 0 |
| 0 1 0 | 0 1 0 | 0 1 0 | 1 0 0 | 0 0 |
| 0 1 0 | 0 1 0 | 1 0 1 | 0 1 1 | 0 0 |
| 0 1 0 | 0 1 0 | 0 1 0 | 0 0 0 | 0 0 |
| 0 1 0 | 0 1 0 | 0 1 0 | 1 0 1 | 0 0 |
| 0 1 0 | 0 1 0 | 0 1 0 | 0 1 0 | 0 0 |
| 0 0 0 | 0 0 0 | 0 0 0 | 1 1 1 | 1 1 |
| 0 0 0 | 0 0 0 | 0 0 0 | 1 1 0 | 1 1 |
| 0 0 0 | 0 0 0 | 1 0 0 | 0 0 0 | 1 1 |
| 0 0 0 | 0 0 0 | 0 0 0 | 0 1 1 | 1 1 |
| 0 0 0 | 0 0 0 | 1 0 0 | 1 0 0 | 1 1 |
| 0 0 0 | 0 0 0 | 1 0 0 | 1 0 1 | 1 1 |
| 0 0 0 | 0 0 0 | 1 0 0 | 0 1 0 | 1 1 |
| 1 0 0 | 1 0 0 | 0 0 0 | 1 1 0 | 1 1 |
| 1 0 0 | 1 0 0 | 0 0 0 | 0 0 0 | 1 1 |
| 1 0 0 | 0 0 0 | 0 1 1 | 0 0 0 | 1 1 |
| 1 0 0 | 0 0 0 | 0 1 1 | 0 1 1 | 1 1 |
| 1 0 0 | 0 0 0 | 0 1 1 | 0 0 1 | 1 1 |
| 1 0 0 | 0 0 0 | 0 1 1 | 1 1 1 | 1 1 |
| 1 0 0 | 0 0 0 | 0 1 1 | 1 1 0 | 1 1 |
| 1 0 0 | 1 0 0 | 1 0 0 | 0 0 0 | 1 0 |
| 1 0 0 | 1 0 0 | 0 0 0 | 0 1 1 | 1 0 |
| 1 0 0 | 1 0 0 | 1 0 0 | 1 0 0 | 1 0 |
| 1 0 0 | 1 0 0 | 0 0 0 | 0 0 1 | 1 0 |
| 1 0 0 | 1 0 0 | 0 0 0 | 1 1 1 | 1 0 |
| 1 0 0 | 1 0 0 | 1 0 0 | 1 0 1 | 1 0 |
| 1 0 0 | 1 0 0 | 1 0 0 | 0 1 0 | 1 0 |
| 1 0 0 | 0 0 0 | 1 1 1 | 1 0 0 | 0 1 |
| 1 0 0 | 0 0 0 | 0 0 1 | 0 1 1 | 0 1 |
| 1 0 0 | 0 0 0 | 1 1 1 | 1 0 1 | 0 1 |
| 1 0 0 | 0 0 0 | 1 1 1 | 0 1 0 | 0 1 |
| 1 0 0 | 0 0 0 | 1 1 1 | 0 0 0 | 0 1 |
| 1 0 0 | 0 0 0 | 0 0 1 | 0 0 1 | 0 1 |
| 1 0 0 | 0 0 0 | 0 0 1 | 0 0 0 | 0 1 |
| 1 0 0 | 1 0 0 | 1 0 1 | 0 0 1 | 0 0 |
| 1 0 0 | 1 0 0 | 1 0 1 | 0 0 0 | 0 0 |
| 1 0 0 | 1 0 0 | 0 1 0 | 1 0 0 | 0 0 |
| 1 0 0 | 1 0 0 | 1 0 1 | 0 1 1 | 0 0 |
| 1 0 0 | 1 0 0 | 0 1 0 | 0 0 0 | 0 0 |
| 1 0 0 | 1 0 0 | 0 1 0 | 1 0 1 | 0 0 |
| 1 0 0 | 1 0 0 | 0 1 0 | 0 1 0 | 0 0 |
| 0 0 0 | 1 1 1 | 1 0 0 | 1 0 1 | 1 1 |
| 0 0 0 | 1 1 1 | 1 0 0 | 0 1 0 | 1 1 |
| 0 0 0 | 0 0 1 | 0 1 1 | 0 0 0 | 1 1 |
| 0 0 0 | 0 0 1 | 0 1 1 | 0 1 1 | 1 1 |
| 0 0 0 | 0 0 1 | 0 1 1 | 0 0 1 | 1 1 |
| 0 0 0 | 0 0 1 | 0 1 1 | 1 1 1 | 1 1 |
| 0 0 0 | 0 0 1 | 0 1 1 | 1 1 0 | 1 1 |
| 0 0 0 | 0 0 1 | 0 0 0 | 0 0 0 | 1 0 |
| 0 0 0 | 0 0 1 | 0 0 1 | 0 1 1 | 1 0 |
| 0 0 0 | 0 0 1 | 0 0 1 | 0 0 1 | 1 0 |
| 0 0 0 | 0 0 1 | 0 0 1 | 0 0 0 | 1 0 |
| 0 0 0 | 0 0 1 | 0 0 0 | 1 0 0 | 1 0 |
| 0 0 0 | 0 0 1 | 0 0 0 | 1 0 1 | 1 0 |
| 0 0 0 | 0 0 1 | 0 0 0 | 0 1 0 | 1 0 |
| 0 0 0 | 1 1 0 | 1 1 0 | 0 0 0 | 0 1 |
| 0 0 0 | 1 1 0 | 1 1 0 | 0 1 1 | 0 1 |
| 0 0 0 | 1 1 0 | 1 1 0 | 0 0 1 | 0 1 |
| 0 0 0 | 1 1 0 | 1 1 0 | 1 1 1 | 0 1 |
| 0 0 0 | 1 1 0 | 1 1 0 | 1 1 0 | 0 1 |
| 0 0 0 | 1 1 0 | 0 0 0 | 1 0 1 | 0 1 |
| 0 0 0 | 1 1 0 | 0 0 0 | 0 1 0 | 0 1 |
| 0 0 0 | 0 0 0 | 1 0 1 | 0 0 1 | 0 0 |
| 0 0 0 | 0 0 0 | 1 0 1 | 0 0 0 | 0 0 |
| 0 0 0 | 0 0 0 | 0 1 0 | 1 0 0 | 0 0 |
| 0 0 0 | 0 0 0 | 1 0 1 | 0 1 1 | 0 0 |

TABLE 4-continued (2.18.2) Look-up Truth TABLE for (2.18.2) Decoder

| Input | | | | Output |
|---|---|---|---|---|
| $Z_1Z_2Z_3$ | $Z_1Z_2Z_3$ | $Z_1Z_2Z_3$ | $Z_1Z_2Z_3$ | $X_1X_2$ |
| 0 0 0 | 0 0 0 | 0 1 0 | 0 0 0 | 0 0 |
| 0 0 0 | 0 0 0 | 0 1 0 | 1 0 1 | 0 0 |
| 0 0 0 | 0 0 0 | 0 1 0 | 0 1 0 | 0 0 |
| 1 0 0 | 1 0 1 | 0 0 0 | 0 0 0 | 1 1 |
| 1 0 0 | 1 0 1 | 0 0 1 | 0 1 1 | 1 1 |
| 1 0 0 | 1 0 1 | 0 0 1 | 0 0 1 | 1 1 |
| 1 0 0 | 1 0 1 | 0 0 1 | 0 0 0 | 1 1 |
| 1 0 0 | 1 0 1 | 0 0 0 | 1 0 0 | 1 1 |
| 1 0 0 | 1 0 1 | 0 0 0 | 1 0 1 | 1 1 |
| 1 0 0 | 1 0 1 | 0 0 0 | 0 1 0 | 1 1 |
| 1 0 0 | 0 1 0 | 1 0 0 | 1 0 1 | 1 0 |
| 1 0 0 | 0 1 0 | 1 0 0 | 0 1 0 | 1 0 |
| 1 0 0 | 1 0 1 | 0 1 1 | 0 0 0 | 1 0 |
| 1 0 0 | 1 0 1 | 0 1 1 | 0 1 1 | 1 0 |
| 1 0 0 | 1 0 1 | 0 1 1 | 0 0 1 | 1 0 |
| 1 0 0 | 1 0 1 | 0 1 1 | 1 1 1 | 1 0 |
| 1 0 0 | 1 0 1 | 0 1 1 | 1 1 0 | 1 0 |
| 1 0 0 | 0 1 0 | 0 0 0 | 0 0 0 | 0 1 |
| 1 0 0 | 0 1 0 | 0 0 0 | 0 1 1 | 0 1 |
| 1 0 0 | 0 1 0 | 1 0 0 | 0 0 0 | 0 1 |
| 1 0 0 | 0 1 0 | 1 0 0 | 1 0 0 | 0 1 |
| 1 0 0 | 0 1 0 | 0 0 0 | 0 0 1 | 0 1 |
| 1 0 0 | 0 1 0 | 0 0 0 | 1 1 1 | 0 1 |
| 1 0 0 | 0 1 0 | 0 0 0 | 1 1 0 | 0 1 |
| 1 0 0 | 0 1 0 | 1 0 1 | 0 0 1 | 0 0 |
| 1 0 0 | 0 1 0 | 1 0 1 | 0 0 0 | 0 0 |
| 1 0 0 | 0 1 0 | 0 1 0 | 1 0 0 | 0 0 |
| 1 0 0 | 0 1 0 | 1 0 1 | 0 1 1 | 0 0 |
| 1 0 0 | 0 1 0 | 0 1 0 | 0 0 0 | 0 0 |
| 1 0 0 | 0 1 0 | 0 1 0 | 1 0 1 | 0 0 |
| 1 0 0 | 0 1 0 | 0 1 0 | 0 1 0 | 0 0 |
| 0 0 0 | 0 0 0 | 1 1 0 | 1 1 0 | 1 1 |
| 0 0 0 | 0 0 0 | 0 0 0 | 1 0 1 | 1 1 |
| 0 0 0 | 0 0 0 | 0 0 0 | 0 1 0 | 1 1 |
| 0 0 1 | 0 0 0 | 0 0 0 | 1 1 0 | 1 1 |
| 0 0 1 | 0 0 0 | 0 0 0 | 0 0 0 | 1 1 |
| 0 0 1 | 0 0 1 | 0 1 1 | 0 0 0 | 1 1 |
| 0 0 1 | 0 0 1 | 0 1 1 | 0 1 1 | 1 1 |
| 0 0 1 | 0 0 1 | 0 1 1 | 0 0 1 | 1 1 |
| 0 0 1 | 0 0 1 | 0 1 1 | 1 1 1 | 1 1 |
| 0 0 1 | 0 0 1 | 0 1 1 | 1 1 0 | 1 1 |
| 0 0 1 | 0 0 1 | 0 0 0 | 0 0 0 | 1 0 |
| 0 0 1 | 0 0 1 | 0 0 1 | 0 1 1 | 1 0 |
| 0 0 1 | 0 0 1 | 0 0 1 | 0 0 1 | 1 0 |
| 0 0 1 | 0 0 1 | 0 0 1 | 0 0 0 | 1 0 |
| 0 0 1 | 0 0 1 | 0 0 0 | 1 0 0 | 1 0 |
| 0 0 1 | 0 0 1 | 0 0 0 | 1 0 1 | 1 0 |
| 0 0 1 | 0 0 1 | 0 0 0 | 0 1 0 | 1 0 |
| 0 0 1 | 0 0 0 | 1 0 0 | 0 0 0 | 0 1 |
| 0 0 1 | 0 0 0 | 0 0 0 | 0 1 1 | 0 1 |
| 0 0 1 | 0 0 0 | 1 0 0 | 1 0 0 | 0 1 |
| 0 0 1 | 0 0 0 | 0 0 0 | 0 0 1 | 0 1 |
| 0 0 1 | 0 0 0 | 0 0 0 | 1 1 1 | 0 1 |
| 0 0 1 | 0 0 0 | 1 0 0 | 1 0 1 | 0 1 |
| 0 0 1 | 0 0 0 | 1 0 0 | 0 1 0 | 0 1 |
| 0 0 1 | 0 0 0 | 1 0 1 | 0 0 1 | 0 0 |
| 0 0 1 | 0 0 0 | 1 0 1 | 0 0 0 | 0 0 |
| 0 0 1 | 0 0 0 | 0 1 0 | 1 0 0 | 0 0 |
| 0 0 1 | 0 0 0 | 1 0 1 | 0 1 1 | 0 0 |
| 0 0 1 | 0 0 0 | 0 1 0 | 0 0 0 | 0 0 |
| 0 0 1 | 0 0 0 | 0 1 0 | 1 0 1 | 0 0 |
| 0 0 1 | 0 0 0 | 0 1 0 | 0 1 0 | 0 0 |
| 0 0 0 | 0 0 0 | 0 0 1 | 0 1 1 | 1 1 |
| 0 0 0 | 0 0 0 | 0 0 1 | 0 0 1 | 1 1 |
| 0 0 0 | 0 0 0 | 0 0 1 | 0 0 0 | 1 1 |
| 0 0 0 | 1 0 1 | 0 0 1 | 0 0 0 | 1 1 |
| 0 0 0 | 1 0 1 | 0 0 1 | 0 1 1 | 1 1 |
| 0 0 0 | 1 0 1 | 0 0 1 | 0 0 1 | 1 1 |
| 0 0 0 | 1 0 1 | 0 0 1 | 0 0 0 | 1 1 |
| 0 0 0 | 1 0 1 | 0 0 0 | 1 0 0 | 1 1 |
| 0 0 0 | 1 0 1 | 0 0 0 | 1 0 1 | 1 1 |
| 0 0 0 | 1 0 1 | 0 0 0 | 0 1 0 | 1 1 |
| 0 0 0 | 0 1 0 | 1 0 0 | 1 0 1 | 1 0 |
| 0 0 0 | 0 1 0 | 1 0 0 | 0 1 0 | 1 0 |
| 0 0 0 | 1 0 1 | 0 1 1 | 0 0 0 | 1 0 |
| 0 0 0 | 1 0 1 | 0 1 1 | 0 1 1 | 1 0 |
| 0 0 0 | 1 0 1 | 0 1 1 | 0 0 1 | 1 0 |
| 0 0 0 | 1 0 1 | 0 1 1 | 1 1 1 | 1 0 |
| 0 0 0 | 1 0 1 | 0 1 1 | 1 1 0 | 1 0 |
| 0 0 0 | 0 1 0 | 0 0 0 | 0 0 0 | 0 1 |
| 0 0 0 | 0 1 0 | 0 0 0 | 0 1 1 | 0 1 |
| 0 0 0 | 0 1 0 | 1 0 0 | 0 0 0 | 0 1 |
| 0 0 0 | 0 1 0 | 1 0 0 | 1 0 0 | 0 1 |
| 0 0 0 | 0 1 0 | 0 0 0 | 0 0 1 | 0 1 |
| 0 0 0 | 0 1 0 | 0 0 0 | 1 1 1 | 0 1 |
| 0 0 0 | 0 1 0 | 0 0 0 | 1 1 0 | 0 1 |
| 0 0 0 | 0 1 0 | 1 0 1 | 0 0 1 | 0 0 |
| 0 0 0 | 0 1 0 | 1 0 1 | 0 0 0 | 0 0 |
| 0 0 0 | 0 1 0 | 0 1 0 | 1 0 0 | 0 0 |
| 0 0 0 | 0 1 0 | 1 0 1 | 0 1 1 | 0 0 |
| 0 0 0 | 0 1 0 | 0 1 0 | 0 0 0 | 0 0 |
| 0 0 0 | 0 1 0 | 0 1 0 | 1 0 1 | 0 0 |
| 0 0 0 | 0 1 0 | 0 1 0 | 0 1 0 | 0 0 |
| 0 1 1 | 0 0 0 | 1 0 0 | 0 0 0 | 1 1 |
| 0 1 1 | 0 0 0 | 0 0 0 | 0 1 1 | 1 1 |
| 0 1 1 | 0 0 0 | 1 0 0 | 1 0 0 | 1 1 |
| 0 1 1 | 0 0 0 | 0 0 0 | 0 0 1 | 1 1 |
| 0 1 1 | 0 0 0 | 0 0 0 | 1 1 1 | 1 1 |
| 0 1 1 | 0 0 0 | 1 0 0 | 1 0 1 | 1 1 |
| 0 1 1 | 0 0 0 | 1 0 0 | 0 1 0 | 1 1 |
| 0 1 1 | 0 1 1 | 0 0 0 | 0 0 0 | 1 0 |
| 0 1 1 | 0 1 1 | 0 0 0 | 1 0 0 | 1 0 |
| 0 1 1 | 0 1 1 | 0 1 1 | 0 0 0 | 1 0 |
| 0 1 1 | 0 1 1 | 0 1 1 | 0 1 1 | 1 0 |
| 0 1 1 | 0 1 1 | 0 1 1 | 0 0 1 | 1 0 |
| 0 1 1 | 0 1 1 | 0 1 1 | 1 1 1 | 1 0 |
| 0 1 1 | 0 1 1 | 0 1 1 | 1 1 0 | 1 0 |
| 0 1 1 | 0 1 1 | 1 1 1 | 1 0 0 | 0 1 |
| 0 1 1 | 0 1 1 | 0 0 1 | 0 1 1 | 0 1 |
| 0 1 1 | 0 1 1 | 1 1 1 | 1 0 1 | 0 1 |
| 0 1 1 | 0 1 1 | 1 1 1 | 0 1 0 | 0 1 |
| 0 1 1 | 0 1 1 | 1 1 1 | 0 0 0 | 0 1 |
| 0 1 1 | 0 1 1 | 0 0 1 | 0 0 1 | 0 1 |
| 0 1 1 | 0 1 1 | 0 0 1 | 0 0 0 | 0 1 |
| 0 1 1 | 0 1 1 | 1 1 0 | 0 0 0 | 0 0 |
| 0 1 1 | 0 1 1 | 1 1 0 | 0 1 1 | 0 0 |
| 0 1 1 | 0 1 1 | 1 1 0 | 0 0 1 | 0 0 |
| 0 1 1 | 0 1 1 | 1 1 0 | 1 1 1 | 0 0 |
| 0 1 1 | 0 1 1 | 1 1 0 | 1 1 0 | 0 0 |
| 0 1 1 | 0 1 1 | 0 0 0 | 1 0 1 | 0 0 |
| 0 1 1 | 0 1 1 | 0 0 0 | 0 1 0 | 0 0 |
| 0 1 1 | 1 1 1 | 1 0 0 | 1 0 1 | 1 1 |
| 0 1 1 | 1 1 1 | 1 0 0 | 0 1 0 | 1 1 |
| 0 1 1 | 0 0 1 | 0 1 1 | 0 0 0 | 1 1 |
| 0 1 1 | 0 0 1 | 0 1 1 | 0 1 1 | 1 1 |
| 0 1 1 | 0 0 1 | 0 1 1 | 0 0 1 | 1 1 |
| 0 1 1 | 0 0 1 | 0 1 1 | 1 1 1 | 1 1 |
| 0 1 1 | 0 0 1 | 0 1 1 | 1 1 0 | 1 1 |
| 0 1 1 | 1 1 1 | 1 0 1 | 0 0 1 | 1 0 |
| 0 1 1 | 1 1 1 | 1 0 1 | 0 0 0 | 1 0 |
| 0 1 1 | 1 1 1 | 0 1 0 | 1 0 0 | 1 0 |
| 0 1 1 | 1 1 1 | 1 0 1 | 0 1 1 | 1 0 |
| 0 1 1 | 1 1 1 | 0 1 0 | 0 0 0 | 1 0 |
| 0 1 1 | 1 1 1 | 0 1 0 | 1 0 1 | 1 0 |
| 0 1 1 | 1 1 1 | 0 1 0 | 0 1 0 | 1 0 |
| 0 1 1 | 1 1 1 | 0 0 0 | 0 0 0 | 0 1 |
| 0 1 1 | 1 1 1 | 0 0 0 | 0 1 1 | 0 1 |
| 0 1 1 | 1 1 1 | 1 0 0 | 0 0 0 | 0 1 |
| 0 1 1 | 1 1 1 | 1 0 0 | 1 0 0 | 0 1 |
| 0 1 1 | 1 1 1 | 0 0 0 | 0 0 1 | 0 1 |
| 0 1 1 | 1 1 1 | 0 0 0 | 1 1 1 | 0 1 |
| 0 1 1 | 1 1 1 | 0 0 0 | 1 1 0 | 0 1 |
| 0 1 1 | 0 0 1 | 0 0 0 | 0 0 0 | 0 0 |
| 0 1 1 | 0 0 1 | 0 0 1 | 0 1 1 | 0 0 |
| 0 1 1 | 0 0 1 | 0 0 1 | 0 0 1 | 0 0 |
| 0 1 1 | 0 0 1 | 0 0 1 | 0 0 0 | 0 0 |
| 0 1 1 | 0 0 1 | 0 0 0 | 1 0 0 | 0 0 |
| 0 1 1 | 0 0 1 | 0 0 0 | 1 0 1 | 0 0 |
| 0 1 1 | 0 0 1 | 0 0 0 | 0 1 0 | 0 0 |
| 0 1 1 | 1 1 0 | 0 0 0 | 0 0 0 | 1 1 |
| 0 1 1 | 1 1 0 | 0 0 0 | 1 0 0 | 1 1 |
| 0 1 1 | 1 1 0 | 0 1 1 | 0 0 0 | 1 1 |
| 0 1 1 | 1 1 0 | 0 1 1 | 0 1 1 | 1 1 |
| 0 1 1 | 1 1 0 | 0 1 1 | 0 0 1 | 1 1 |
| 0 1 1 | 1 1 0 | 0 1 1 | 1 1 1 | 1 1 |
| 0 1 1 | 1 1 0 | 0 1 1 | 1 1 0 | 1 1 |

TABLE 4-continued

(2,18,2) Look-up Truth TABLE for (2,18,2) Decoder

| Input | | | | Output |
|---|---|---|---|---|
| $Z_1Z_2Z_3$ | $Z_1Z_2Z_3$ | $Z_1Z_2Z_3$ | $Z_1Z_2Z_3$ | $X_1X_2$ |
| 0 1 1 | 1 1 0 | 1 1 1 | 1 0 0 | 1 0 |
| 0 1 1 | 1 1 0 | 0 0 1 | 0 1 1 | 1 0 |
| 0 1 1 | 1 1 0 | 1 1 1 | 1 0 1 | 1 0 |
| 0 1 1 | 1 1 0 | 1 1 1 | 0 1 0 | 1 0 |
| 0 1 1 | 1 1 0 | 1 1 1 | 0 0 0 | 1 0 |
| 0 1 1 | 1 1 0 | 0 0 1 | 0 0 1 | 1 0 |
| 0 1 1 | 1 1 0 | 0 0 1 | 0 0 0 | 1 0 |
| 0 1 1 | 1 1 0 | 1 1 0 | 0 0 0 | 0 1 |
| 0 1 1 | 1 1 0 | 1 1 0 | 0 1 1 | 0 1 |
| 0 1 1 | 1 1 0 | 1 1 0 | 0 0 1 | 0 1 |
| 0 1 1 | 1 1 0 | 1 1 0 | 1 1 1 | 0 1 |
| 0 1 1 | 1 1 0 | 1 1 0 | 1 1 0 | 0 1 |
| 0 1 1 | 1 1 0 | 0 0 0 | 1 0 1 | 0 1 |
| 0 1 1 | 1 1 0 | 0 0 0 | 0 1 0 | 0 1 |
| 0 1 1 | 0 0 0 | 1 0 1 | 0 0 1 | 0 0 |
| 0 1 1 | 0 0 0 | 1 0 1 | 0 0 0 | 0 0 |
| 0 1 1 | 0 0 0 | 0 1 0 | 1 0 0 | 0 0 |
| 0 1 1 | 0 0 0 | 1 0 1 | 0 1 1 | 0 0 |
| 0 1 1 | 0 0 0 | 0 1 0 | 0 0 0 | 0 0 |
| 0 1 1 | 0 0 0 | 0 1 0 | 1 0 1 | 0 0 |
| 0 1 1 | 0 0 0 | 0 1 0 | 0 1 0 | 0 0 |

We claim:

1. A data storage system in which data is written on and read from a data storage medium, comprising:
   an encoder that receives digital electrical signals representing serial binary input data and comprises:
   (i) a serial-to-parallel converter that converts two sequentially chosen bits of binary input data into two parallel bits;
   (ii) a register for holding a five-bit current-state denoting vector of the encoder; and
   (iii) a read only memory lookup table that, from an address specified by said two parallel bits and five-bit current-state-denoting vector, generates a five-bit next state vector that is supplied to and updates the register and also generates a five-bit codeword chosen from one of the following eight possible codewords: 00000, 00001, 00010, 00100, 01000, 10000, 10010, 01001 for encoding the binary input data into a (2, 18, 2) code;
   (iv) a five-bit parallel-to serial converter for converting the five-bit codeword into electrical signals as a string of serial (2, 18, 2) binary encoded data; and
   a transducer for writing the serial (2, 18, 2) binary encoded data onto the medium.

2. The system of claim 1, characterized in that the lookup table constitutes a finite state machine that has the following 25 states and paths between states for converting the binary input data into the string of serial (2, 18, 2) binary encoded data, the two sequentially chosen input bits being 00, 01, 10 or 11, and the next state and five-bit codeword being as denoted by hyphenated sequences below:

| Current State | INPUT DATA | | | |
|---|---|---|---|---|
| | 00 | 01 | 10 | 11 |
| 01 | 04-00100 | 17-00100 | 18-00100 | 19-00100 |
| 02 | 06-00100 | 20-00100 | 21-00100 | 22-00100 |
| 03 | 01-00100 | 02-00100 | 03-00100 | 05-00100 |
| 04 | 13-00000 | 14-00000 | 15-00000 | 16-00000 |
| 05 | 08-00000 | 11-00000 | 23-00000 | 10-00000 |
| 06 | 04-00001 | 05-00001 | 06-00001 | 07-00001 |
| 07 | 01-00001 | 02-00001 | 03-00001 | 09-00001 |
| 08 | 13-01000 | 14-01000 | 15-01000 | 16-01000 |

-continued

| Current State | INPUT DATA | | | |
|---|---|---|---|---|
| | 00 | 01 | 10 | 11 |
| 09 | 04-00000 | 17-00000 | 18-00000 | 19-00000 |
| 10 | 20-00000 | 21-00000 | 06-00000 | 22-00000 |
| 11 | 08-01000 | 10-01000 | 11-01000 | 23-01000 |
| 12 | 01-00000 | 02-00000 | 03-00000 | 24-00000 |
| 13 | 13-00010 | 14-00010 | 15-00010 | 16-00010 |
| 14 | 09-00010 | 10-00010 | 11-00010 | 12-00010 |
| 15 | 01-01001 | 02-01001 | 03-01001 | 08-00010 |
| 16 | 04-01001 | 05-01001 | 06-01001 | 07-01001 |
| 17 | 04-10000 | 17-10000 | 18-10000 | 19-10000 |
| 18 | 06-10000 | 20-10000 | 21-10000 | 22-10000 |
| 19 | 01-10000 | 02-10000 | 03-10000 | 05-10000 |
| 20 | 09-10010 | 10-10010 | 11-10010 | 12-10010 |
| 21 | 13-10010 | 14-10010 | 15-10010 | 16-10010 |
| 22 | 01-00001 | 02-00001 | 03-00001 | 08-10010 |
| 23 | 01-00000 | 02-00000 | 03-00000 | 09-01000 |
| 24 | 08-00000 | 11-00000 | 23-00000 | 25-00000 |
| 25 | 20-00000 | 21-00000 | 18-00000 | 19-00000 |

3. The system of claim 1, wherein the transducer comprises a diode laser and the data storage system is an optical disk system.

4. The system of claim 1, wherein the transducer comprises a magnetic recording head and the data storage system is a magnetic recording system.

5. The system of claim 1, including
   a sliding block decoder that decodes the string of serial (2, 18, 2) binary encoded data read from the medium into the serial binary input data, and comprises:
   (i) a first shift register for converting the string of (2, 18, 2) serial binary encoded data into four five-bit codewords;
   (ii) codeword reassignment logic circuitry for converting each five-bit codeword into a reassigned three-bit codeword representation;
   (iii) an address register means comprising three four-bit shift registers for collecting sets of four adjacent three-bit codeword representations;
   (iv) a read only memory look up table for converting each reassigned three-bit codeword representation to a two-bit output corresponding to a then current set of four three-bit codeword representations; and
   (v) means including a second register, a multiplexor and a third register connected in series for converting successive two-bit outputs into the serial binary data.

6. A sliding block decoder for decoding into serial binary data a string of serial rate m/n code data read from a data recording medium, said apparatus comprising:
   a first shaft register for converting the serial string to j n-bit codewords;
   codeword reassignment logic circuitry for converting each n-bit codeword into a reassigned k-bit codeword representation, where k<n;
   address register means comprising k j-bit shift registers for collecting sets of j adjacent k-bit codeword representations;
   a read only memory look up table for converting each reassigned k-bit codeword representation to an m-bit output corresponding to a then current set of j k-bit codeword representations; and
   means including a second register, a multiplexor and a third register connected in series for converting successive m-bit outputs into the serial binary data.

7. The decoder of claim 6, wherein m=2, k=3, j=4 and n=5 for decoding a rate 2/5 (2, 18, 2) run length limited code.

* * * * *